(12) United States Patent
Fletcher et al.

(10) Patent No.: US 9,863,998 B2
(45) Date of Patent: Jan. 9, 2018

(54) ELECTRICAL FAULT LOCATION METHOD

(71) Applicant: ROLLS-ROYCE plc, London (GB)

(72) Inventors: Steven Fletcher, Glasgow (GB);
Patrick Norman, East Kilbride (GB);
Stuart J Galloway, Edinburgh (GB)

(73) Assignee: ROLLS-ROYCE plc, London (GB)

(*) Notice: Subject to any disclaimer, the term of this patent is extended or adjusted under 35 U.S.C. 154(b) by 0 days.

(21) Appl. No.: 15/359,441

(22) Filed: Nov. 22, 2016

(65) Prior Publication Data

US 2017/0176510 A1    Jun. 22, 2017

(30) Foreign Application Priority Data

Dec. 21, 2015    (GB) .................................. 1522489.2

(51) Int. Cl.
  *G01R 31/02*    (2006.01)
  *G01R 31/08*    (2006.01)
(52) U.S. Cl.
  CPC ........... *G01R 31/08* (2013.01); *G01R 31/088* (2013.01)
(58) Field of Classification Search
  CPC ............. G01R 31/025; G01R 31/2875; G01R 31/2874; G01R 31/02; G01R 19/0092;
  (Continued)

(56) References Cited

U.S. PATENT DOCUMENTS 3,515,986 A * 6/1970 Peschel ................ G01R 31/021
                                                          324/536
4,866,391 A * 9/1989 Latham, Jr. ............ G01R 27/20
                                                          324/357
(Continued)

FOREIGN PATENT DOCUMENTS

CN    103 683 996 A    3/2014
CN    104 950 224 A    9/2015
(Continued)

OTHER PUBLICATIONS

Jun. 21, 2016 Search Report issued in British Patent Application No. 1522489.2.
(Continued)

*Primary Examiner* — Jermele M Hollington
*Assistant Examiner* — Taqi Nasir
(74) *Attorney, Agent, or Firm* — Oliff PLC

(57) ABSTRACT

A method of determining the location of a fault within a first inductive part of an electrical circuit, including a voltage source, first inductive part and second inductive part. A shortened circuit created by the fault includes the voltage source, a portion of the first inductive part and the second, connected in series. The fault occurs across first and second points in the first inductive part. The length of first inductive part between a positive terminal and first point is substantially equal to the length of first inductive part between a negative terminal and second point. The voltage source supplies a known voltage $V_s$ when the fault occurs and the second inductive part has a known inductance $L_2$ when the fault occurs. The method takes advantage of the initial transient response of the circuit to determine the inductance of the portion of the first inductive part in the shortened circuit.

13 Claims, 1 Drawing Sheet

(58) Field of Classification Search
CPC .... G01R 31/086; G01R 31/024; G01R 31/08; G01R 31/2856; G01R 31/40
USPC .......... 324/509, 512, 528, 531, 544, 750.03, 324/718, 726, 722, 713, 772; 361/5, 42, 361/101, 98, 50, 88, 31, 58, 49, 19; 340/947, 946, 664, 531, 650
See application file for complete search history.

(56) References Cited

U.S. PATENT DOCUMENTS

| | | | |
|---|---|---|---|
| 6,421,618 B1* | 7/2002 | Kliman | G01R 31/025 324/500 |
| 6,573,726 B1* | 6/2003 | Roberts | H02H 3/081 324/509 |
| 8,395,391 B2 | 3/2013 | Potter et al. | |
| 8,842,401 B2 | 9/2014 | Hill et al. | |
| 8,907,680 B2* | 12/2014 | Sakakibara | B60L 3/00 320/108 |
| 2003/0071632 A1* | 4/2003 | Indermaur | G01R 31/2853 324/512 |
| 2008/0106268 A1* | 5/2008 | Lewinski | G01R 31/025 324/509 |
| 2012/0200966 A1* | 8/2012 | Hill | G01R 31/024 361/62 |
| 2013/0304406 A1 | 11/2013 | Kim | |

FOREIGN PATENT DOCUMENTS

| | | |
|---|---|---|
| EP | 0 185 887 A2 | 7/1986 |
| EP | 2 485 354 A1 | 8/2012 |
| GB | 1 204 901 A | 9/1970 |
| JP | 2004-045118 A | 2/2004 |

OTHER PUBLICATIONS

May 12, 2017 Extended Search Report issued in European Patent Application No. 16200023.6.

* cited by examiner

ELECTRICAL FAULT LOCATION METHOD

The present disclosure concerns locating electrical faults, in electrical circuits. It may have particular application to DC circuits and further to circuits where conductors are provided in close proximity separated by insulation which might be expected to degrade over time.

Several methods of remotely determining the location of faults in electrical circuits are known. Such detection may save time and effort in isolating and/or conducting repairs on the relevant part of a circuit by comparison with a physical search for the fault. In particular the conductors may be very long (e.g. overhead power lines), hidden by insulation (an insulated cable having multiple conductors therein) or only inconveniently accessible. Such known location methods are often however dependent on the presence of particular components being present within the circuit (or not being present) and further are often suited only to alternating current circuits rather than direct current circuits. There is an increasing interest in the use of direct current power distribution throughout the power industry. This interest is largely driven by the increased usage and advance of power electronic technologies which have facilitated more interconnected and efficient use of direct current systems. Recently proposed applications for direct current range from large scale multi-terminal systems, such as for offshore grid applications, to smaller scale applications such as microgrids, ships and aircraft.

Some existing fault locating techniques are usable with direct current circuits. They include the use of electrical travelling waves and wavelet analysis. This method is based on the concept that the occurrence of an electrical fault sets up a travelling wave which propagates out from the point of fault. Current and voltage travelling waves are related in both time and origin which, using wavelet analysis, allows a fault's location to be determined. Disadvantages of these techniques include their poor detection of nearby faults. Due to very short travel time from nearby faults, the travelling waves cannot be easily distinguished without the use of high measurement speeds and sampling. Furthermore the travelling waves may be damped and reflected by any discontinuities in conductor impedance, making their use less attractive for systems with large inductive filters.

Another fault detection and location approach based on the analysis of travelling waves has been proposed and is better suited to smaller scale systems. Rather than measuring the initial travelling waves resulting from the occurrence of a fault on the system, the proposed approach is based on the injection of current pulses into a network to facilitate fault location. It is the reactions from these injected currents which can be used to determine fault location. Drawbacks of this approach are that an additional indicator is required to trigger this injection of current, limiting its potential for use as a primary protection system.

According to a first aspect there is provided a method of determining the location of a fault within a first inductive part of an electrical circuit, where the electrical circuit comprises a voltage source, the first inductive part and a second inductive part and a shortened circuit of the electrical circuit created by the fault comprises the voltage source, a portion of the first inductive part and the second inductive part, all connected in series, and where further the fault occurs across first and second points in the first inductive part, the length of first inductive part between a positive terminal of the voltage source and the first point being substantially equal to the length of first inductive part between a negative terminal of the voltage source and the second point, and where further the voltage source supplies a known voltage $V_s$ at the time the fault occurs and the second inductive part has a known inductance $L_2$ at the time the fault occurs, the method comprising:
i) determining a voltage $V_2$ across the second inductive part immediately after the fault occurs;
ii) equating the ratio of $V_2$ to $V_s$ with the ratio of $L_2$ to $L_2$+an unknown inductance $L_{1s}$ of the portion of the first inductive part in the shortened circuit;
iii) determining the length $l_{1s}$ of the portion of the first inductive part by either:
 a) expressing $L_{1s}$ in the equation of ii) as a proportion $n_s$ of a known inductance $L_1$ of the first inductive part, solving for $n_s$ and, given that the first inductive part is known to have a linear inductance to length relationship, equating $n_s$ with the ratio of $l_{1s}$ to a known length $l_1$ of the first inductive part and solving for $l_{1s}$;
 or:
 b) solving for $L_{1s}$ in the equation of ii) and either:
  i) given that the first inductive part is known to have a linear inductance to length relationship, equating the ratio of $L_{1s}$ to a known inductance $L_1$ of the first inductive part with the ratio of $l_{1s}$ to a known length $l_1$ of the first inductive part and solving for $l_{1s}$; or
  i) using $L_{1s}$ in combination with a known inductance to length relationship of the first inductive part to determine $l_{1s}$;
iv) inferring the location of the fault as occurring at the position along the electrical circuit at which $\frac{1}{2}l_{1s}$ is exhausted when starting from either of the positive and negative terminals.

In view of the inductive properties of the first and second inductive parts, the current flowing through them cannot instantaneously change in response to the occurrence of the fault. Assuming therefore that there are no further inductive parts of any significance contained within the shortened circuit, the voltage delivered by the voltage source immediately after the fault occurs will be substantially divided between the second inductive part and the portion of the first inductive part in the shortened circuit. The division of the voltage will be in proportion to the respective magnitudes of the inductances of the portion of the first inductive part and the second inductive part. The method of the first aspect takes advantage of this initial transient response to determine the inductance of the portion of the first inductive part in the shortened circuit. With its inductance determined, the length of the portion can be determined based on a known inductance to length relationship or equivalent data. This length of the second inductive part is indicative of the fault location (i.e. its distance along the electrical circuit from one or other of the positive and negative terminals).

As will be appreciated the parameters having known values ($V_s$, $L_2$, and as appropriate, the inductance to length relationship of the first inductive part and/or $l_1$ and $L_1$) may be known by means of calculation, experimental determination, circuit analysis, by reference to a predetermined component/part rating or by any other suitable means. Further determination of these values may be undertaken at any time (e.g. before, during or after occurrence of the fault). Therefore and by way of example, $V_s$ may be known before the occurrence of the fault based on a voltage rating of the voltage source, or the voltage of the voltage source may be measured at and/or immediately after and/or some later time after occurrence of the fault.

As will be appreciated, the determining step of i) should be interpreted to include steps that effectively give rise to a determination of the relevant voltage (e.g. knowledge of the resistance of the second inductive part and measurement of current flowing there through immediately after the fault occurs).

In some embodiments the first and second inductive parts encompass all inductive parts of the shortened circuit.

In some embodiments the first and second points are respectively on positive and negative sides of the electrical circuit with respect to an interconnecting network. Put another way the first and second points are respectively on a supply conductor and a return conductor of the electrical circuit.

In some embodiments the proportion $n_s$ of $L_1$ is calculated in accordance with the equation:

$$n_s = \frac{L_2}{L_1}\left(\frac{V_s}{V_2} - 1\right)$$

and the calculated $n_s$ is multiplied by $l_1$ to give $l_{1s}$.

In some embodiments the electrical circuit further comprises a circuit breaker and the method includes activating the circuit breaker to break the circuit immediately after the fault has occurred. This may reduce or prevent damage to components of the electrical circuit which might otherwise arise from large fault currents. In some embodiments the electrical circuit comprises multiple circuit breakers. In this case the method may include activating a selected one of the circuit breakers to break the circuit immediately after the fault has occurred, the selected circuit breaker being determined in accordance with the location of the fault location inferred.

In some embodiments the first and second points are respectively on separate conductors of the electrical circuit.

In some embodiments the separate conductors are provided in a single insulated structure. The structure may for instance be a cable. Such an arrangement may be susceptible to giving rise to a fault between the conductors in the event of insulator break-down. Such arrangements may also bring parts of the conductors that are the same length along the circuit from a respective terminal of the power source into close proximity.

In some embodiments the first inductive part is electrical wiring. In some embodiments the first inductive part comprises distribution busbars. In such embodiments the method may indicate the location of the fault in the wiring or busbars as appropriate.

In some embodiments the second inductive part comprises an inductive filter or current limiting inductor. Such components may reduce current fluctuations in the electrical circuit and/or contribute to the reduction in or prevention of damage to components of the electrical circuit which might otherwise arise from large fault currents.

In some embodiments the second inductive part comprises multiple inductive components. As will be appreciated the method remains valid where various inductive components, each with (potentially different) known inductances and voltage drops measured thereacross, are incorporated within the second inductive part. In that case the known $L_2$ value would then be the sum of the inductances of all of the components and the determined value $V_2$ would be the sum of all voltage drops across the components.

In some embodiments the electrical circuit is a direct current circuit. The method may be particularly advantageous in the context of fault location in DC circuits where alternatives suitable for use in AC circuits only are not appropriate.

According to a second aspect there is provided an electrical fault locator for an electrical circuit comprising a processor programmed to perform the method of the first aspect.

In some embodiments the electrical fault locator further comprises a voltmeter arranged in use to measure and send a $V_2$ value to the processor.

According to a third aspect there is provided a computer program that, when read by a computer, causes performance of the method of the first aspect.

According to a fourth aspect there is provided a non-transitory computer readable storage medium comprising computer readable instructions that, when read by a computer, cause performance of the method of the first aspect.

According to a fifth aspect there is provided a signal comprising computer readable instructions that, when read by a computer, cause performance of the method of the first aspect.

The skilled person will appreciate that except where mutually exclusive, a feature described in relation to any one of the above aspects may be applied mutatis mutandis to any other aspect. Furthermore except where mutually exclusive any feature described herein may be applied to any aspect and/or combined with any other feature described herein.

Embodiments will now be described by way of example only, with reference to the Figures, in which.

Figure 1:
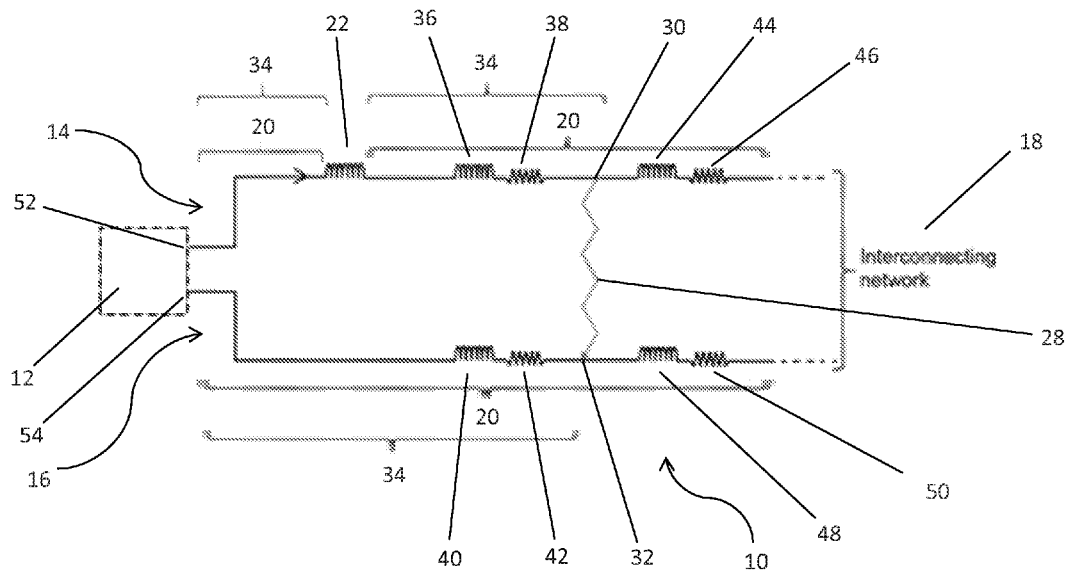
FIG. 1 is a circuit diagram of a circuit on with respect to which an embodiment of the invention is described.

With reference to FIG. 1 an electrical circuit is generally provided at 10. The electrical circuit 10 comprises an electrical generator 12 supplying direct current. In alternative embodiments the electrical generator 12 could be replaced with an alternative voltage source, such as a battery, power converter or capacitor.

The electrical circuit 10 further comprises a positive side 14 and a negative side 16 with respect to an interconnecting network 18 there between. The positive side 14 comprises some of a first inductive part 20, in this case electrical wiring and a second inductive part 22, in this case a current limiting inductor. The negative side 16 comprises the remainder of the first inductive part 20 (in this case electrical wiring). The first 20 and second 22 inductive parts are in series with one another. The interconnecting network comprises a number of electrical components powered in use via the electrical generator 12.

The electrical circuit 10 is further provided with a pair of voltmeters (not shown), one across the electrical generator 12 for measuring its voltage output and one across the second inductive part 22 for measuring the voltage dropped thereacross. A circuit breaker (not shown) is also provided within the electrical circuit 10 arranged to break the circuit in the event of an electrical fault.

A fault 28 is shown occurring at and between first 30 and second 32 points on the first inductive part 20. The first 30 and second 32 points are on separate wires of the electrical circuit 10, one wire forming part of the positive side 14 and the other forming part of the negative side 16. The fault 28 creates a new shortened circuit comprising the electrical generator 12, a portion 34 of the first inductive part 20 and the second inductive part 22. As will be appreciated some of the first inductive part 20 is not part of the shortened circuit. The portion 34 of the first inductive part 20 forming part of the shortened circuit on the positive side 14 has an inductance represented by inductor 36 and a resistance represented by resistor 38. Similarly the portion 34 of the first inductive part 20 forming part of the shortened circuit on the negative side 16 has an inductance represented by inductor 40 and a resistance represented by resistor 42. The remainder of the first inductive part 20 not part of the shortened circuit on the positive side 14 has an inductance represented by inductor 44 and a resistance represented by resistor 46. Similarly the remainder of the first inductive part 20 not part of the shortened circuit on the negative side 16 has an inductance represented by inductor 48 and a resistance represented by resistor 50.

The first inductive part 20 has a linear inductance to length relationship (it constitutes lengths of similar homogeneous electrical wiring). Thus the inductances assignable to the inductors 36, 40, 44 and 48 depends on the lengths of the respect wire runs. Further the inductance $L_1$ of the whole of the first inductive part 20 will be split between these inductors 36, 40, 44, 48 in accordance with the respective wire run lengths.

The length of first inductive part 20 between a positive terminal 52 of the electrical generator 12 and the first point 30 (which is nearer the positive terminal 52) is substantially equal to the length of first inductive part 20 between a negative terminal 54 of the electrical generator 12 and the second point 32 (which is nearer the negative terminal) 54. The only electrical circuit 10 constituents between the positive terminal 52 and the first point 30 are the second inductive part 22 and the portion 34 of the first inductive part 20 forming part of the shortened circuit on the positive side 14. The only electrical circuit 10 constituent between the negative terminal 54 and the second point 32 is the portion 34 of the first inductive part 20 forming part of the shortened circuit on the negative side 16.

Figure 2:
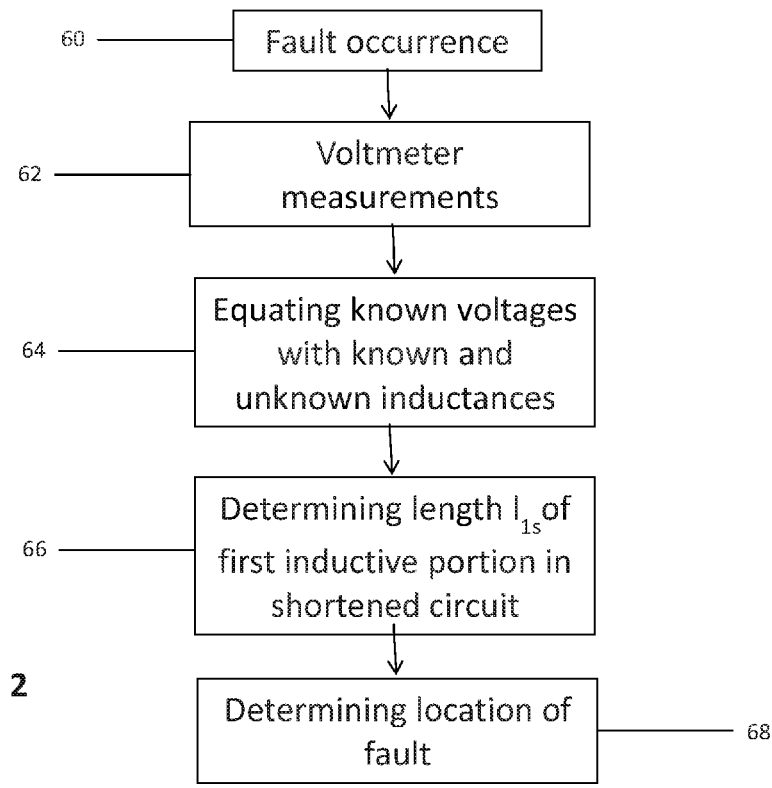
FIG. 2 is a flow diagram of method steps in accordance with an embodiment of the invention.

Referring now to FIG. 2 a method of determining the fault location within the first inductive part 20 is described.

Several parameters pertaining to the electrical circuit 10 are known. A voltage $V_s$ provided by the electrical generator 12 and a voltage $V_2$ dropped across the second inductive part 22 are known at the time the fault 28 occurs in accordance with the measurements made by the respective voltmeters. An inductance $L_2$ of the second inductive part 22 at the time the fault occurs is known in accordance with an inductance rating of the second inductive part 22. The length $l_1$ of the whole of the first inductive part 20 and its inductance $L_1$ are known in accordance with previously performed measurements.

When the fault 28 occurs at step 60, the second inductive part 22 protects the electrical circuit 10 from high fault currents until the circuit breaker activates. Immediately after the fault 28 occurs there is no instantaneous current change through the second inductive part 22 and the portion 34 of the first inductive part in the shortened circuit. Consequently $V_s$ is dropped across the second inductive part 22 and the portion 34. Immediately after the fault 28 occurs a determination of $V_2$ and $V_s$ is made by voltmeter measurements at step 62. Alternatively the voltage $V_s$ may be determined by voltmeter measurements before the fault 28 occurs or during the fault 28, for example if the voltage $V_s$ is routinely measured during use. At step 64 the ratio of $V_2$ to $V_s$ is equated with the ratio of $L_2$ to $L_2$+an unknown inductance $L_{1s}$ of the portion 34 of the first inductive part in the shortened circuit, e.g.:

$$\frac{V_2}{V_s} = \frac{L_2}{L_2 + L_{1s}}$$

In step 66 the length $l_1$, of the portion 34 of the first inductive part is determined by calculation. This is achieved by first expressing $L_{1s}$ in the equation above as a proportion $n_s$ of the known inductance $L_1$ of the first inductive part 20 and solving for $n_s$, e.g.:

$$n_s = \frac{L_2}{L_1}\left(\frac{V_s}{V_2} - 1\right)$$

and thereafter equating $n_s$ with the ratio of $l_{1s}$ to the known length $l_1$ of the first inductive part (recalling that the first inductive part 20 is known to have a linear inductance to length relationship) and solving for $l_{1s}$, e.g.:

$$l_{1s} = n_s l_1$$

Finally in step 68 the location of the fault (i.e. the position of the first 30 and/or second 32 points) is inferred as the position along the electrical circuit 10 at which $\frac{1}{2}l_{1s}$ is exhausted when starting from either of the positive 52 and negative 54 terminals.

The voltmeter measurements of step 62 are sent as signals to a processor (not shown) of an electrical fault detector (not shown) which then performs steps 64, 66 and 68.

It will be understood that the invention is not limited to the embodiments above-described and various modifications and improvements can be made without departing from the concepts described herein. By way of example the second inductive part may comprise a number of discrete components, with the known $L_2$ value then being the sum of the inductances of all of the components and the known value $V_2$ being the sum of all voltage drops across the components. By way of a further example, as an alternative to expressing $L_{1s}$ as the proportion $n_s$ of the known inductance $L_1$ of the first inductive part, $L_{1s}$ may itself be calculated and used in combination with known values for $L_1$ and to find $l_{1s}$. Similarly the method may be employed even where the inductance to length relationship is not linear, but where the inductance to length relationship is nonetheless known. Except where mutually exclusive, any of the features may be employed separately or in combination with any other features and the disclosure extends to and includes all combinations and sub-combinations of one or more features described herein.

The invention claimed is:

1. A method of determining the location of a fault within a first inductive part of an electrical circuit, where the electrical circuit comprises a voltage source, the first inductive part and a second inductive part and a shortened circuit of the electrical circuit created by the fault comprises the voltage source, a portion of the first inductive part and the second inductive part, all connected in series, and where further the fault occurs across first and second points in the first inductive part, the length of first inductive part between a positive terminal of the voltage source and the first point being substantially equal to the length of first inductive part between a negative terminal of the voltage source and the second point, and where further the voltage source supplies a known voltage $V_s$ at the time the fault occurs and the second inductive part has a known inductance $L_2$ at the time the fault occurs, the method comprising:

i) determining a voltage $V_2$ across the second inductive part immediately after the fault occurs;

ii) equating the ratio of $V_2$ to $V_s$ with the ratio of $L_2$ to $L_2$+an unknown inductance $L_{1s}$ of the portion of the first inductive part in the shortened circuit;

iii) determining the length $l_{1s}$ of the portion of the first inductive part by either:

a) expressing $L_{1s}$ in the equation of ii) as a proportion $n_s$ of a known inductance $L_1$ of the first inductive part, solving for $n_s$ and, given that the first inductive part is known to have a linear inductance to length relationship, equating $n_s$ with the ratio of $l_{1s}$ to a known length of the first inductive part and solving for $l_{1s}$;

or:

b) solving for $L_{1s}$ in the equation of ii) and either:

i) given that the first inductive part is known to have a linear inductance to length relationship, equating the ratio of $L_{1s}$ to a known inductance $L_1$ of the first inductive part with the ratio of $l_{1s}$ to a known length of the first inductive part and solving for $l_{1s}$; or i) using $L_{1s}$ in combination with a known inductance to length relationship of the first inductive part to determine $l_{1s}$;

iv) inferring the location of the fault as occurring at the position along the electrical circuit at which $½l_{1s}$ is exhausted when starting from either of the positive and negative terminals.

2. A method of determining the location of a fault in according to claim 1 where the first and second inductive parts encompass all inductive parts of the shortened circuit.

3. A method of determining the location of a fault in according to claim 1 where the first and second points are respectively on positive and negative sides of the electrical circuit with respect to an interconnecting network.

4. A method of determining the location of a fault according to claim 1 where the proportion $n_s$ of $L_1$ is calculated in accordance with the equation:

$$n_s = \frac{L_2}{L_1}\left(\frac{V_s}{V_2} - 1\right)$$

and the calculated $n_s$ is multiplied by $l_1$ to give $l_{1s}$.

5. A method of determining the location of a fault according to claim 1 where the electrical circuit further comprises a circuit breaker and the method includes activating the circuit breaker to break the circuit immediately after the fault has occurred.

6. A method of determining the location of a fault according to claim 1 where the first and second points are respectively on separate conductors of the electrical circuit.

7. A method of determining the location of a fault according to claim 6 where the separate conductors are provided in a single insulated structure.

8. A method of determining the location of a fault according to claim 1 where the second inductive part comprises an inductive filter or current limiting inductor.

9. A method of determining the location of a fault according to claim 1 where the second inductive part comprises multiple inductive components.

10. A method of determining the location of a fault according to claim 1 where the electrical circuit is a direct current circuit.

11. An electrical fault locator for an electrical circuit comprising a processor programmed to perform the method of claim 1.

12. An electrical fault locator according to claim 11 further comprising a voltmeter arranged in use to measure and send a $V_2$ value to the processor.

13. A computer program that, when read by a computer, causes performance of the method of claim 1.

* * * * *